(12) United States Patent
Kato

(10) Patent No.: US 6,504,231 B2
(45) Date of Patent: Jan. 7, 2003

(54) BIPOLAR TRANSISTOR IN WHICH IMPURITIES ARE INTRODUCED FROM EMITTER ELECTRODE MATERIAL TO FORM EMITTER REGION

(75) Inventor: Hiroshi Kato, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/862,375

(22) Filed: May 22, 2001

(65) Prior Publication Data

US 2001/0042900 A1 Nov. 22, 2001

(30) Foreign Application Priority Data

May 22, 2000 (JP) .......................... 2000-150271

(51) Int. Cl.[7] ............................................ H01L 27/082
(52) U.S. Cl. ..................... 257/565; 257/587; 257/588; 257/593
(58) Field of Search ........................... 29/571; 156/656, 156/657; 257/565, 587, 588, 593; 437/31, 33, 90, 99, 162

(56) References Cited

U.S. PATENT DOCUMENTS 4,125,426 A * 11/1978 Inayoshi et al. ... 148/DIG. 106
4,586,238 A * 5/1986 Yatsuda et al. ..... 148/DIG. 117
4,824,799 A * 4/1989 Komatsu ..................... 257/51
5,185,276 A    2/1993 Chen et al.
5,204,276 A * 4/1993 Nakajima et al. .. 148/DIG. 124
5,296,391 A * 3/1994 Sato et al. ........... 148/DIG. 10
5,500,554 A * 3/1996 Sato ........................... 257/588

FOREIGN PATENT DOCUMENTS

| JP | 06-291133 | 10/1994 |
| JP | 07-130760 | 5/1995 |
| JP | 08-335584 | 12/1996 |

OTHER PUBLICATIONS

Markus, H.A.W. et al., "Low–Frequency Noise in Polysilicon Emitter Bipolar Transistors", *IEEE Transactions On Electron Devices,* vol. 42, No. 4, pp. 720–727, Apr. 1995.

* cited by examiner

*Primary Examiner*—Hoai Ho
*Assistant Examiner*—Dao H. Nguyen
(74) *Attorney, Agent, or Firm*—Choate, Hall & Stewart

(57) ABSTRACT

A first insulating film 4 having a first opening portion is formed on an emitter region 10 and a second insulating film 6 having a second opening portion smaller than the first opening portion is formed on the first insulating film 4. The first and second opening portions are buried with emitter electrode material 9 doped with impurities.

5 Claims, 3 Drawing Sheets

BIPOLAR TRANSISTOR IN WHICH IMPURITIES ARE INTRODUCED FROM EMITTER ELECTRODE MATERIAL TO FORM EMITTER REGION

BACKGROUND OF THE INVENTION

1. Field of the Invention

The present invention relates to a bipolar transistor and particularly, to a bipolar transistor in which impurities are introduced from emitter electrode material in which the impurities are introduced, thereby forming an emitter region.

2. Description of the Related Art

FIG. 1 shows the structure of a conventional bipolar transistor.

As shown in FIG. 1, collector region 2 is provided on N⁺substrate 1, and element separating oxide film 3 is provided on the collector region 2. Electrode 11 is provided above emitter region 10 and base region 5 through oxide film 4 and nitride film 6.

The oxide film 4 and the nitride film 6 are perforated to form base contact hole 7 for connecting the base region 5 and the electrode 11 and emitter contact hole 8 for connecting the emitter region 10 and the electrode 11. The emitter contact hole 8 is buried with polysilicon (polycrystal silicon) containing arsenic with which the emitter region 10 is formed, and the electrode 11 is provided on the polysilicon 9. The base contact hole 7 is buried with the conductive material of the electrode 11.

Japanese Laid-open Patent Publication No. Hei-6-291133, Japanese Laid-open Patent Publication No. Hei-7-130760, Japanese Laid-open Patent Publication No. Hei-8-335584, Japanese Examined Patent Publication No. Hei-7-123126 disclose techniques pertaining to the present invention.

In the technique shown in FIG. 1, if the overall device is designed in a microstructure in order to form the base contact hole 7 and the emitter contact hole 8 on the base region 5 and the emitter region 10 at the same time in a dry etching process, the emitter contact hole 8 would be narrow. In addition, the area of the emitter region would be small because the emitter region is formed by introducing impurities of polysilicon 9 in the emitter contact hole 8.

SUMMARY OF THE INVENTION

An object of the present invention is to provide a bipolar transistor in which the area of an effective emitter region can be increased without narrowing an emitter contact hole.

In order to attain the above object, according to the present invention, there can be provided a bipolar transistor includes an emitter region formed in a base region; a first insulating film formed on the emitter region so as to have a first opening portion provided on the emitter region; and a second insulating film formed on the first insulating film so as to have a second opening portion smaller than the first opening portion provided on the first opening portion, wherein emitter electrode material doped with impurities is buried in the first and second opening portions.

DETAILED DESCRIPTION OF THE PREFERRED EMBODIMENTS

Preferred embodiments according to the present invention will be described hereunder with reference to the accompanying drawings.

Figure 2:
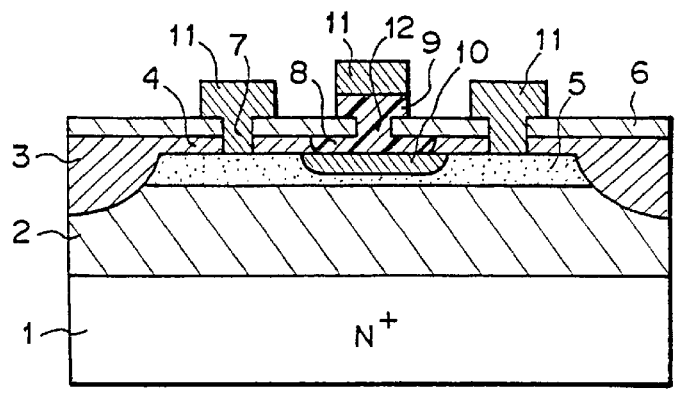
FIG. 2 is a longitudinally-sectional view showing the structure of an embodiment of a bipolar transistor according to the present invention.

FIG. 2 is a longitudinally-sectional view showing the structure of an embodiment of a bipolar transistor according to the present invention.

Collector region 2 that is epitaxially formed so as to have an impurity concentration of $5 \times 10^{15} cm^{-3}$ is provided on N⁺ substrate 1 having resistivity of about 13 mΩ·cm which is obtained by doping antimony or arsenic into a semiconductor substrate. Further, element separating oxide film 3 having a thickness of 1 μm, and oxide film 4 having a thickness of 50 μm and nitride film 6 having a thickness of 150 nm for separating electrode 11 from emitter region 10 and base region 5 are provided on the collector region 2.

The oxide film 4 and the nitride film 6 are perforated to form base contact hole 7 having a width of 0.5 μm for connecting the base region 5 and the electrode 11, contact hole 12 having a width of 0.5 μm, and emitter contact hole 8 having a width (for example, 1.2 μm) larger than that of the contact hole 12. The emitter contact hole 8 is buried with polysilicon (polycrystal silicon) 9 which has a thickness of 150 nm and contains arsenic to form the emitter region 10, and the electrode 11 is provided on the polysilicon 9. Further, the base contact hole 7 is buried with the conductive material of the electrode 11.

Next, a method of manufacturing the bipolar transistor according to the present invention will be described. FIGS. 3 to 9 are longitudinally-sectional views showing the bipolar transistor manufacturing method according to the present invention.

Figure 3:
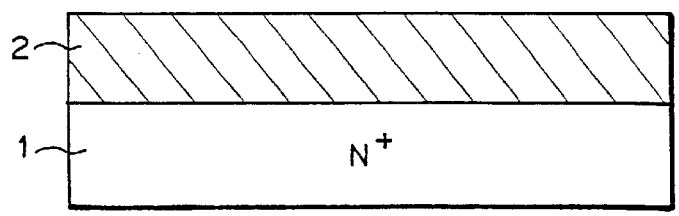
FIG. 3 is a longitudinally-sectional view showing a step of a method of manufacturing the bipolar transistor according to the present invention.

First, as shown in FIG. 3, collector region 2 is epitaxially grown on an N⁺ substrate 1 having resistivity of 13 mΩ·cm and containing arsenic or antimony while being doped with phosphorus of about $5 \times 10^{15} cm^{-2}$.

Figure 4:
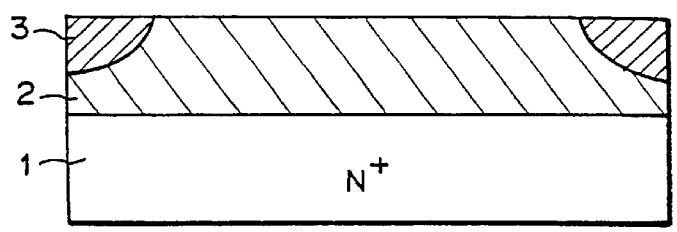
FIG. 4 is a longitudinally-sectional view showing another step of the method of manufacturing the bipolar transistor according to the present invention.

Subsequently, an oxide film of 50 nm in thickness and a nitride film are grown by CVD method or the like. Thereafter, through a lithography step, the nitride film is left at the portions other than a region where an element separating oxide film will be formed, and then an oxidation treatment is carried out. Subsequently, the nitride film and the oxide film are removed by wet etching or the like, thereby selectively forming oxide film 3 only partially as shown in FIG. 4.

Figure 5:
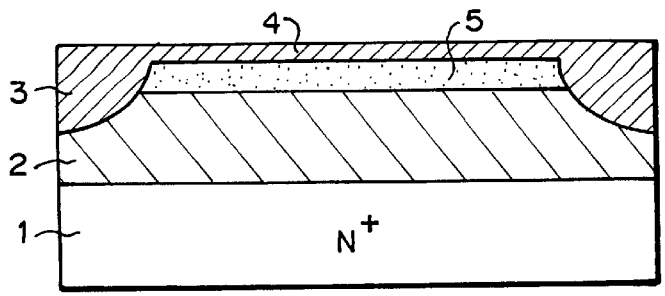
FIG. 5 is a longitudinally-sectional view showing another step of the method of manufacturing the bipolar transistor according to the present invention.
Figure 6:
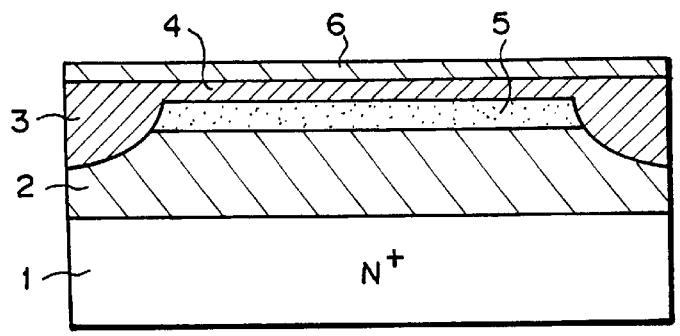
FIG. 6 is a longitudinally-sectional view showing another step of the method of manufacturing the bipolar transistor according to the present invention.

Subsequently, oxide film 4 is grown so as to have a thickness of about 30 nm by an oxidizing step, and then boron is implanted with acceleration energy of about 30 KeV (kilo electron volt) to form base region 5 having an impurity concentration of about $1 \times 10^{18} \text{cm}^{-3}$. This step is shown in FIG. 5. Further, nitride film 6 having a thickness of about 150 nm is formed by the CVD method as shown in FIG. 6.

Figure 7:
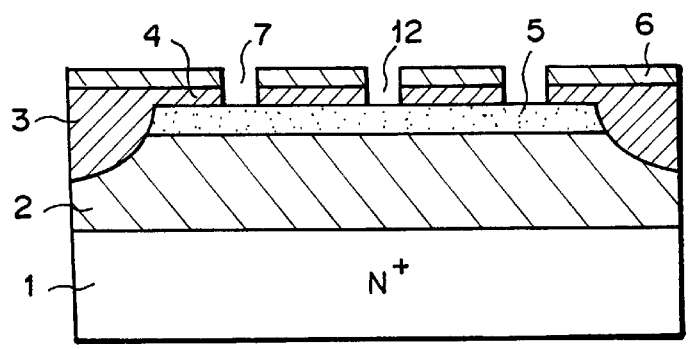
FIG. 7 is a longitudinally-sectional view showing another step of the method of manufacturing the bipolar transistor according to the present invention.
Figure 8:
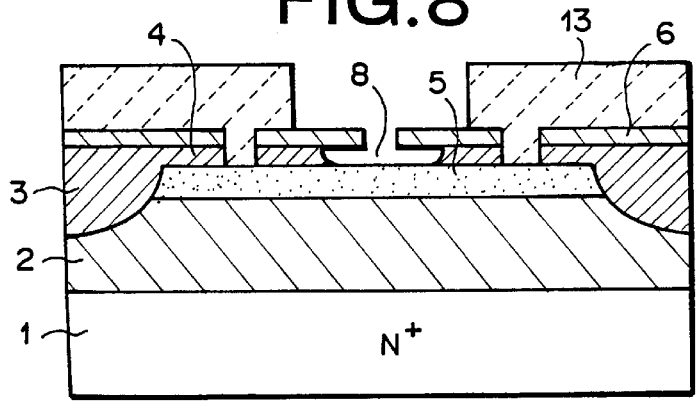
FIG. 8 is a longitudinally-sectional view showing another step of the method of manufacturing the bipolar transistor according to the present invention.

Subsequently, base contact hole 7 and contact hole 12 are formed by patterning a resist in a lithography step and carrying out dry etching as shown in FIG. 7. Subsequently, as shown in FIG. 8, the oxide film 4 is subjected to wet etching by using as a mask a photoresist 13 that is perforated at only the contact hole portion of the emitter region in a lithography step, thereby forming emitter contact hole 8.

Figure 9:
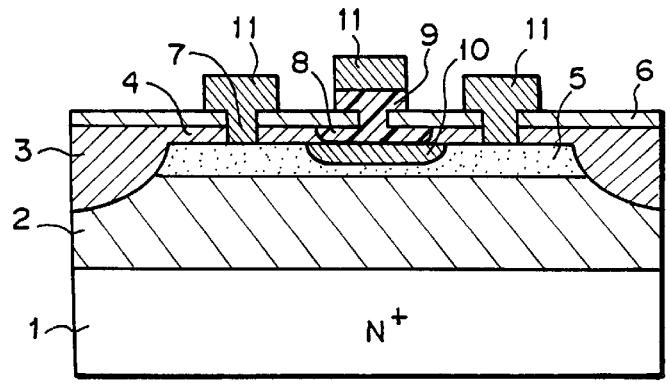
FIG. 9 is a longitudinally-sectional view showing another step of the method of manufacturing the bipolar transistor according to the present invention.

Subsequently, as shown in FIG. 9, in order to form an emitter region, arsenic is doped simultaneously with the growth to deposit polysilicon serving as an emitter electrode material, and then polysilicon 9 remains only above emitter region 10 in the lithography step. Thereafter, the emitter region 10 is formed by a thermal treatment step, for example, by a thermal treatment step at 900° C. for about 40 minutes. Subsequently, the electrode 11 is formed on the base contact 7 and on the polysilicon 9.

Figure 1:
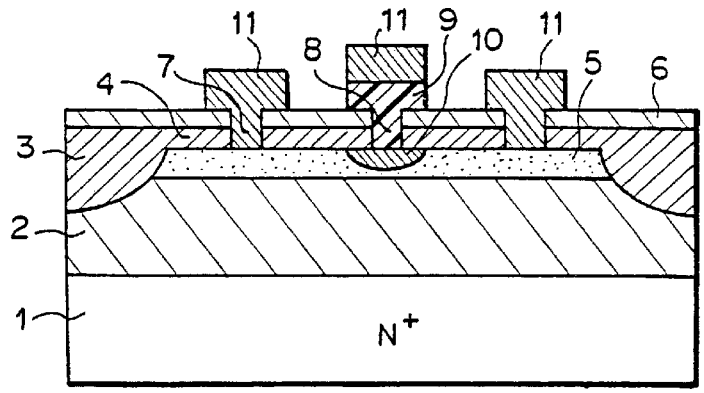
FIG. 1 is a longitudinally-sectional view showing the structure of a conventional polar transistor.

As compared with the conventional structure shown in FIG. 1, if the overall device is microstructured to form the base contact hole 7 and the emitter contact hole 8 on the base region 5 and the emitter region 10 at the same time by dry etching in the conventional structure shown in FIG. 1, the emitter contact hole 8 would be narrowed. For example, when the emitter contact hole is formed at a pitch of 4 μm, the, width of the emitter contact hole is equal to about 0.5 μm. However, in this embodiment, the width of the emitter contact hole can be increased to a value larger than 0.5 μm (for example, 1.2 μm).

In general, the low frequency noise S of the bipolar transistor is in inverse proportion to the area of the emitter, and expressed by the following equation (IEEE Trans. E.D. Vol. 42, No. Apr. 4, 1995 Low-Frequency Noise in Polysilicon Emitter Bipolar Transistors H. A. W. Markus et al).

$$S \propto (IB/AE)^k$$

Here, IB represents the base current, AE represents the area of the emitter and k represents a constant. The simplest method to increase the area of the emitter is to increase the number of emitter fingers. However, this method causes the area of the base and thus increases the collector-base junction capacitance, so that it is difficult to achieve a high oscillation frequency. On the other hand, in order to increase the oscillation frequency, it is important to make the base area small and reduce the collector-base junction capacitance. However, in order to narrow the base area and thus make the design rule suitable for the microstructure, the emitter contact hole is needed to be narrowed, so that the area of the emitter is smaller and thus the low frequency noise cannot be reduced. Therefore, in order to keep a high oscillation frequency and reduce the low frequency noise, it is required to increase the effective emitter area with the contact hole being kept microstructured.

According to this embodiment, after the contact hole is perforated, the emitter contact hole is further etched by wet etching to be broader than the contact hole, polysilicon is formed while impurities are doped and the impurities are thermally diffused from the polysilicon to form the emitter region, so that the effective emitter area can be increased with keeping the design rule to be suitable for the microstructure.

In the above embodiment, when emitter polysilicon is formed, the impurities (arsenic) are simultaneously doped. However, the same effect could be expected if polysilicon is formed by the CVD method and then arsenic is doped by the ion implantation method.

Figure 10:
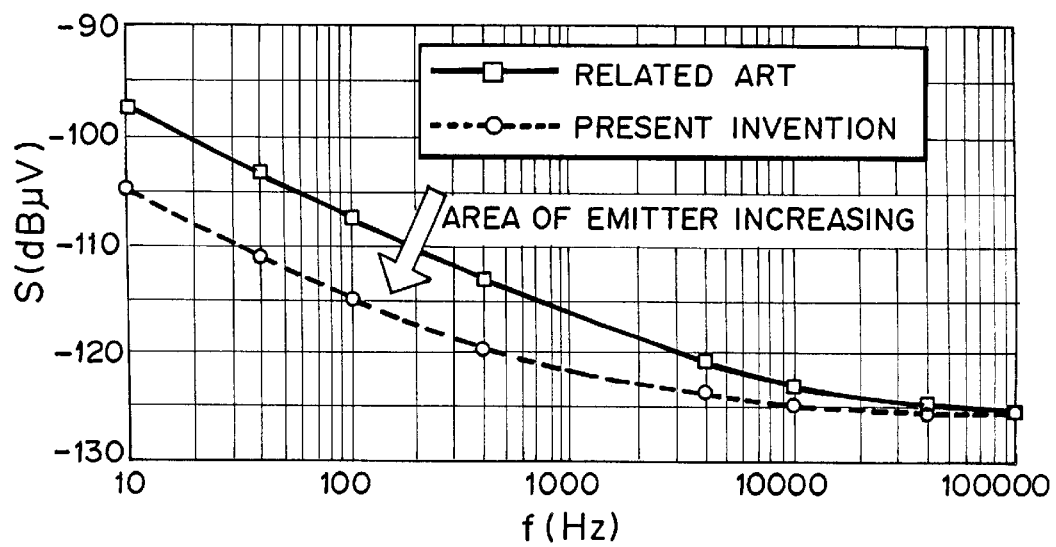
FIG. 10 is a characteristic diagram showing a frequency-low frequency noise characteristic.

FIG. 10 shows an experiment result. The abscissa of FIG. 10 represents the frequency, and the ordinate of FIG. 10 represents the low frequency noise. As shown in FIG. 10, a difference of 5 dBμV occurs at a detuning frequency 1 kHz between the low frequency noise of the conventional structure shown in FIG. 1 (for example, the emitter contact pitch of 4 μm and the effective emitter width of 0.6 μm) and the low frequency noise of the present invention (the effective emitter width of 1.2 μm).

In general, the low frequency noise is greatly effected by C/N when a transistor is used for an oscillator, and it is an important factor in design of oscillators to use transistors having low frequency noises. Therefore, the present invention can be more effectively applied.

As described above, according to the present invention, the effective emitter area can be increased with keeping the design rule suitable for the microstructure.

What is claimed is:

1. A bipolar transistor comprising:

an emitter region formed in a base region on a semiconductor material;

a first insulating film formed on said emitter region so as to have a first opening portion having at least a selected width and a length provided on said emitter region; and a second insulating film formed on said first insulating film so as to have a second opening portion having a width and a length that are both smaller than said first opening portion provided on said first opening portion forming an overhang of said second insulating film that extends substantially completely around the emitter region, wherein an emitter electrode material doped with impurities is buried in said first and second opening portions, and the emitter region has a dimension related to the selected width and length of said first insulating film.

2. The bipolar transistor as claimed in claim 1, wherein said emitter region in said base region on said semiconductor material is formed by diffusing the impurities that are doped in said emitter electrode material into said semiconductor material using said first insulator film as a control mask.

3. The bipolar transistor as claimed in claim 1, wherein said first insulating film is an oxide film and said second insulating film is a nitride film.

4. The bipolar transistor as claimed in claim 1, wherein said emitter electrode material includes polycrystal semiconductor.

5. The bipolar transistor as claimed in claim 2, wherein said emitter electrode material includes polycrystal semiconductor.

* * * * *